(12) United States Patent
Tomioka et al.

(10) Patent No.: US 6,421,912 B1
(45) Date of Patent: Jul. 23, 2002

(54) METHOD OF MAKING AN ELECTRICAL CONNECTOR

(75) Inventors: Shoichi Tomioka; Tsutomu Matsuo, both of Tokyo (JP)

(73) Assignee: Hirose Electric Co., Ltd., Tokyo (JP)

( * ) Notice: Subject to any disclaimer, the term of this patent is extended or adjusted under 35 U.S.C. 154(b) by 43 days.

(21) Appl. No.: 09/580,549

(22) Filed: May 30, 2000

(30) Foreign Application Priority Data

Jul. 23, 1999 (JP) .............................. 11-208462

(51) Int. Cl.⁷ .............................................. H01R 43/02
(52) U.S. Cl. .............................. 29/879; 29/843; 29/874; 29/878
(58) Field of Search .................. 29/874, 882, 843, 29/830, 840, 878

(56) References Cited

U.S. PATENT DOCUMENTS

| | | | | |
|---|---|---|---|---|
| 3,373,481 A | * | 3/1968 | Lins et al. | |
| 3,569,607 A | * | 3/1971 | Martyak et al. | |
| 3,932,934 A | * | 1/1976 | Lynch et al. | |
| 4,692,843 A | * | 9/1987 | Matsumoto et al. | |
| 4,705,205 A | * | 11/1987 | Allen et al. | |
| 4,788,767 A | * | 12/1988 | Desai et al. | |
| 4,949,455 A | * | 8/1990 | Nakamura et al. | 29/843 |
| 5,626,278 A | * | 5/1997 | Tang | 29/843 |

FOREIGN PATENT DOCUMENTS

| | | |
|---|---|---|
| JP | JP 8-315877 | 11/1996 |
| JP | JP 9-129807 | 5/1997 |
| JP | JP 10-233574 | 9/1998 |

* cited by examiner

Primary Examiner—Carl J. Arbes
(74) Attorney, Agent, or Firm—Kanesaka & Takeuchi

(57) ABSTRACT

A method of making an electrical connector having a housing (2) and a plurality of contact elements with connection sections (4) projecting from the housing, which comprises filling a regular recess (12) provided in the upper face (11) of a mold member (10) with a solder material (14A), putting the front ends of the connection sections into the solder material, solidifying the solder material, and removing the connection sections from the mold member.

4 Claims, 4 Drawing Sheets

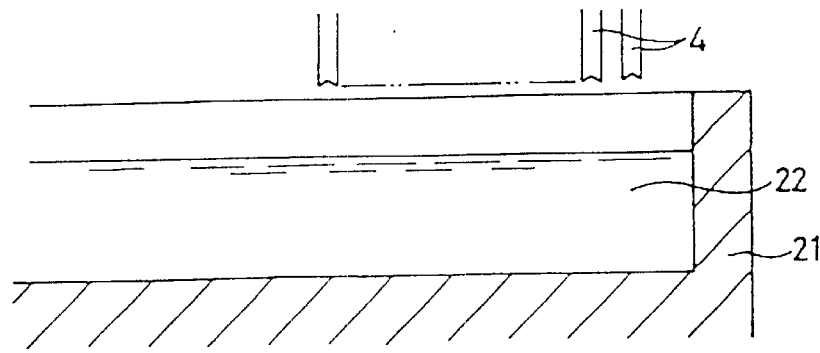
FIG. 4(A)
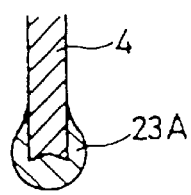
FIG. 4(B)
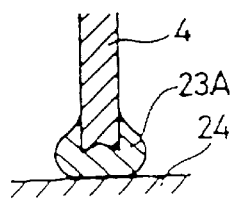
FIG. 4(C)
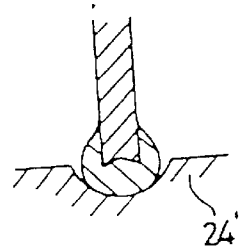
FIG. 4(C')
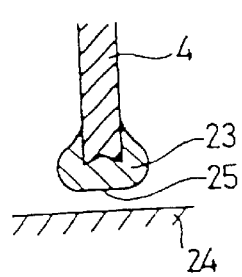
FIG. 4(D)
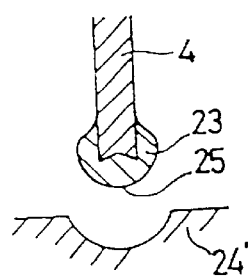
FIG. 4(D')

METHOD OF MAKING AN ELECTRICAL CONNECTOR

BACKGROUND OF THE INVENTION

1. Field of the Invention

The present invention relates to electrical connectors and methods of making the same.

2. Related Art

Electrical connectors with the connection sections of contact elements soldered to a circuit board or the like are designed such that the connection sections project from the housing by a constant length. The connection sections are provided on circuit traces of the circuit board, a cream or paste-like solder is applied, and the connection sections are soldered simultaneously. Alternatively, solder balls are provided as connection sections. That is, the solder balls are provided on circuit traces and heated to melt for soldering.

The contact elements are made to a single size but always involved with manufacturing errors. In addition, there are errors in installation into the housing, manufacturing the housing, and warping of the housing. These errors are added up to put the connection sections of contact elements on different planes, making poor soldering or failing to provide uniform soldering for the contact sections which are not contacted but spaced from the circuit traces. Similarly, the solder balls make uneven contact with the circuit traces so that the solder balls suffer from uneven heating conditions, resulting in the poor or uneven soldering.

SUMMARY OF THE INVENTION

Accordingly, it is an object of the invention to provide an electrical connector having contact elements whose connection sections make even contact with the same surface regardless of errors of the contact elements and the housing.

According to one aspect of the invention there is provided an electrical connector which comprises a housing; a plurality of contact elements attached to said housing such that connection sections thereof project from said housing; a plurality of solder portions provided on front ends of said connection sections and having regular surfaces which are positioned on a single plane.

Since the solder portions of a plurality of contact elements have regular surfaces which are disposed on a single plane and make even contact with corresponding circuit traces, poor or uneven soldering is prevented. The regular surfaces may be flat or curved.

According to another aspect of the invention there is provided a method of making an electrical connector with a plurality of contact elements having connection sections projecting from said housing, which comprises the steps of forming a plurality of regular recesses in an upper face of a mold member; filling said regular recesses with solder; putting front ends of said connection sections into said solder in said regular recesses; solidifying said solder; and removing said connection sections from said mold member.

According to still another aspect of the invention there is provided a method of making an electrical connector with a plurality of contact elements having connection sections projecting from said housing, which comprises the steps of applying solder to front ends of said connection sections; pressing said front ends with solder against a base surface; solidifying said solder; and removing said connection sections from said base surface.

Alternatively, the pressing step is replaced by pressing said front ends with solder against a base surface to melt said solder by heat of said base surface.

According to yet another aspect of the invention there is provided a method of making an electrical connector with a plurality of contact elements having connection sections projecting from said housing, which comprises the steps of simultaneously putting front ends of said connection sections into a melted solder in a soldering tank; pulling said front ends of said connection sections out of said melted solder to form solder masses adhered to said front ends of said connection sections; pressing said solder masses of said connection sections against a base surface; solidifying said solder masses; and removing said solder masses of said connection sections from said base surface.

The connection sections prior to formation of the solder portions may take any shape but the shape to which melted solder adheres readily and the solidified solder firmly adhered is preferred.

BRIEF DESCRIPTION OF THE DRAWINGS

FIGS. 4(A)–(D) and (C')–(D') are sectional views showing how to make a solder portion according to other embodiments of the invention.

DESCRIPTION OF THE PREFERRED EMBODIMENTS

Embodiments of the invention will now be described with reference to the accompanying the drawings.

Figure 1:
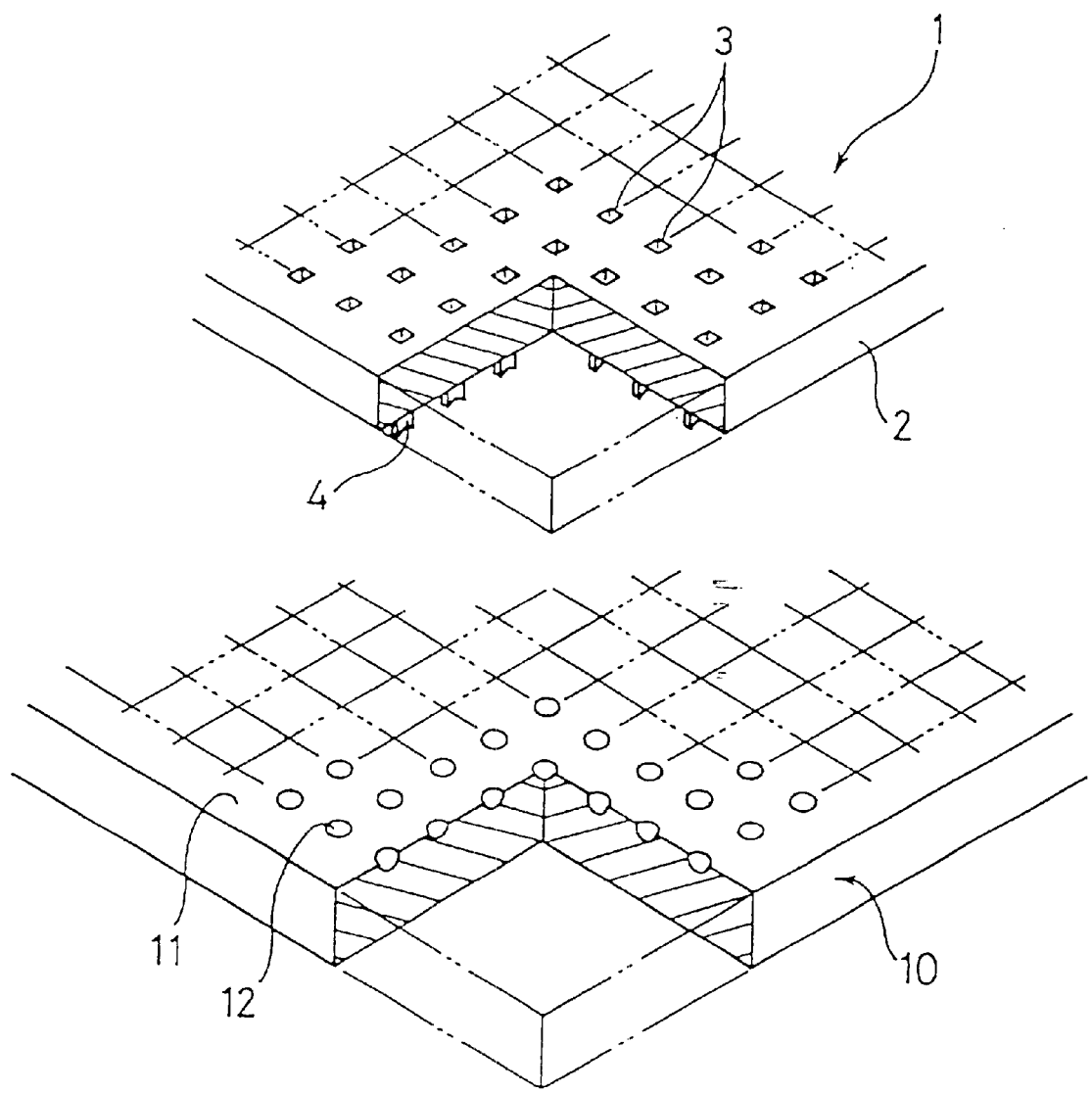
FIG. 1 is a perspective view, partially in section, of a connector and a mold member according to an embodiment of the invention.
Figure 2A:
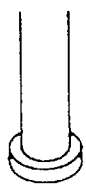
FIGS. 2(A)–(I) are perspective views of a connection section for the connector.
Figure 2B:
Figure 2C:
Figure 2D:
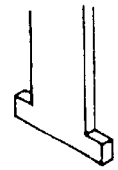
Figure 2E:
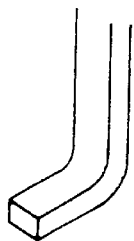
Figure 2F:
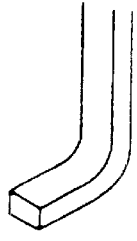
Figure 2G:
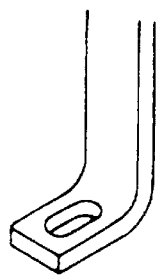
Figure 2I:
Figure 2H:

In FIG. 1, a connector 1 is an intermediate electrical connector to connect two circuit boards or the like. However, the invention is applicable to any electrical connector having a plurality of contact elements whose connection sections project from the housing for soldering.

A housing 2 is made of a dielectric material so as to have a plate-like shape. A plurality of apertures 3 are provided in the housing 2 for receiving the contact elements. The contact pins of a connection object or circuit board (not shown) are put into the apertures 3. Connection sections 4 project from the bottom of the housing 2 for soldering to the corresponding circuit traces of another connection object or circuit board (not shown).

FIGS. 2(A)–(I) show examples of the connection section 4. The examples 2(A)–(H) are made by working on the tip of a pin or strip of metal but the example 2(I) is a solder ball provided on the circuit board.

Referring back to FIG. 1, a mold member 10 has an upper surface 11 with a predetermined flatness, and semi-spherical regular recesses 12 are provided in the upper surface 11 at positions corresponding to the connection sections 4. The connector 1 and the mold member 10 are positioned relative to each other so that when the connector 1 is lowered, the connection sections 4 reach the corresponding regular recesses 12.

In order to form a soldering portion on the connection section 4, each recess 12 of the mold member 10 is filled with a solder material. The connector 1 is then lowered such that the connection section 4 enters the solder material and pulled up after the solder becomes hard, thereby providing the connection section 4 with a semi-spherical solder mass having a regular bottom surface which is able to make even contact with a face. The solder material in the regular recess 12 may be either melted or solid which is melt after the connection section is put into the solder material. In the latter case, electrodes are provided on the mold member 10 to conduct electric current so as to melt the solder material such as shown in FIGS. 3(A)–(D).

Figure 3A:
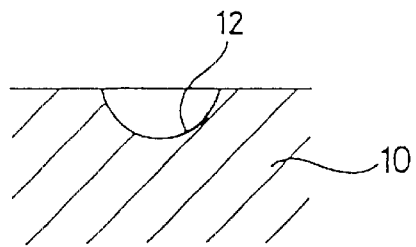
FIGS. 3(A)–(D) are sectional views of the mold member showing how to make a solder portion for the connector.

In FIG. 3(A), the mold member 10 has one or more regular recesses 12.

Figure 3B:
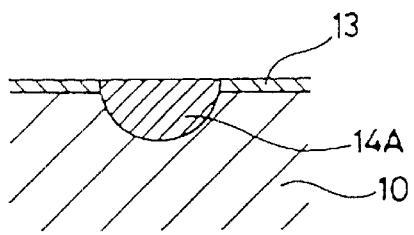

In FIG. 3(B), a masking plate or sheet 13 is provided on the mold member 10 such that an aperture of the masking plate corresponds to the regular recess 12, and a solid solder material 14A is filled in the regular recess 12.

Figure 3C:
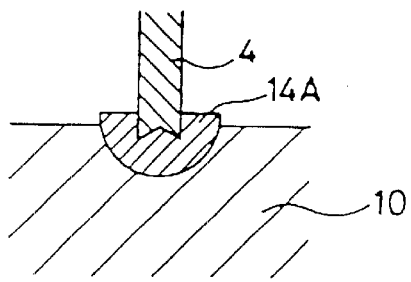

In FIG. 3(C), the masking plate 13 is removed from the mold member 10. It prevents a solder material from adhering to areas other than the regular recess 12. The front end of the connection section 4 is put into the solder material 14A, which is then melted as described above.

Figure 3D:
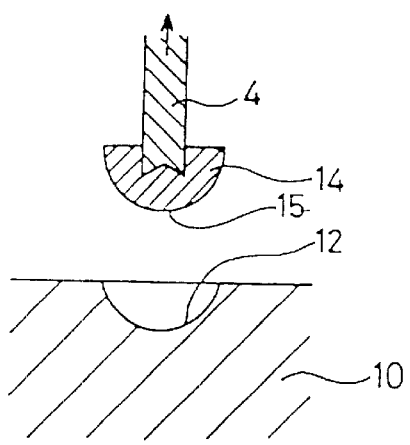

In FIG. 3(D), after the solder mass becomes hard, the connection section 4 is removed from the mold member 10, providing a solder portion 14 which has a semi-spherical regular surface 15.

FIGS. 4(A)–(D) shows another embodiment to form a solder portion.

In FIG. 4(A), a melted solder 22 is put in a soldering tank 21. A plurality of connection sections 4 of a connector are simultaneously put into the melted solder 22 and then pulled up to form a melted solder mass 23A on the front end of a connection section 4 as shown in FIG. 4(B).

In FIG. 4(C), the melted solder mass 23A is pressed against a cooling base 24 which has a flat surface.

In FIG. 4(D), after the solder mass 23A becomes hard, the connection section 4 is pulled up from the cooling base 24, providing a solder mass 23 having a regular surface 25 which is defined by the flat cooling base 24.

Alternatively, a portion of the base surface 24' is made concave as shown in FIG. 4(C') in order to provide a solder mass 23 which has a convex regular surface 25 as shown in FIG. (D').

The soldering tank may be replaced by directly applying melted solder to the connection sections. The melted solder may be replaced with solid or paste-like solder, wherein the solder is melted by a contact base.

According to the invention, the solder portions of connection sections are provided on the same plane so that it is possible to provide even soldering and prevent poor soldering regardless of errors in manufacturing and installing contact elements in the housings. In addition, the stress produced at a time when contact elements are formed is somewhat released under the soldering heat.

Also, it is possible to simultaneously make a large number of solder sections with regular surfaces without difficulty regardless of the shape of connection sections.

What is claimed is:

1. A method of making an electrical connector with a plurality of contact elements having connection sections with each said connection section having at least one front end located proximate to said connection section end projecting from a housing of said connector, comprising the steps of:

forming a plurality of regular recesses in an upper face of a mold member;

filling said regular recesses with solder;

putting each said front end of said connection sections into said solder in said regular recesses;

solidifying said solder; and removing said connection sections from said mold member, thereby forming regular surfaces on lower faces of said solder.

2. A method of making an electrical connector with a plurality of contact elements having connection sections projecting from a housing of said connector, comprising the steps of:

applying solder to front ends of said connection sections;

pressing said front ends with solder against a base surface;

solidifying said solder; and removing said connection sections from said base surface, thereby forming regular surfaces on lower faces of said solder.

3. A method according to claim 2, wherein said pressing step is pressing said front ends with solder against a base surface to thereby melt said solder by heat of said base surface.

4. A method of making an electrical connector with a plurality of contact elements having connection sections projecting from a housing of said connector, comprising the steps of:

simultaneously putting front ends of said connection sections into a melted solder in soldering tank;

putting said front ends of said connection sections out of said melted solder to form solder masses adhered to said front ends of said connection sections;

pressing said solder masses of said connection sections against a base surface;

solidifying said solder masses; and removing said solder masses of said connection sections from said base surface, thereby forming regular surfaces on lower faces of said solder.

* * * * *